United States Patent
A Tharumalingam

(10) Patent No.: US 9,305,967 B1
(45) Date of Patent: Apr. 5, 2016

(54) WAFER LEVEL OPTOELECTRONIC DEVICE PACKAGES AND METHODS FOR MAKING THE SAME

(71) Applicant: Intersil Americas LLC, Milpitas, CA (US)

(72) Inventor: Sri Ganesh A Tharumalingam, Fremont, CA (US)

(73) Assignee: INTERSIL AMERICAS LLC, Milpitas, CA (US)

( * ) Notice: Subject to any disclaimer, the term of this patent is extended or adjusted under 35 U.S.C. 154(b) by 0 days.

(21) Appl. No.: 14/749,169

(22) Filed: Jun. 24, 2015

Related U.S. Application Data

(60) Provisional application No. 62/148,575, filed on Apr. 16, 2015.

(51) Int. Cl.
*H01L 27/146* (2006.01)
*H01L 21/768* (2006.01)
*H01L 25/16* (2006.01)
*H01L 31/16* (2006.01)
*H01L 31/18* (2006.01)

(52) U.S. Cl.
CPC ...... *H01L 27/1469* (2013.01); *H01L 21/76898* (2013.01); *H01L 25/167* (2013.01); *H01L 27/14623* (2013.01); *H01L 27/14629* (2013.01); *H01L 27/14634* (2013.01); *H01L 27/14636* (2013.01); *H01L 27/14685* (2013.01); *H01L 31/165* (2013.01); *H01L 31/186* (2013.01)

(58) Field of Classification Search
CPC .................. H01L 24/94; H01L 31/16–31/173
See application file for complete search history.

(56) References Cited

U.S. PATENT DOCUMENTS

2013/0334445 A1* 12/2013 Tharumalingam ...... H01L 24/97
250/552

OTHER PUBLICATIONS

Charbonnier et al., "Wafer Level Packaging Technology Development for CMOS Image Sensors Using Through Silicon Vias," 2nd Electronics Systemintegration Technology Conference, Greenwich, UK, 2008, 8 pages.

Lieb et al., "Tapered Through-Silicon-Via Interconnects for Wafer-Level Packaging of Sensor Devices," IEEE Transactions on Advanced Packaging, vol. 33, No. 3, Aug. 2010, 9 pages.

* cited by examiner

*Primary Examiner* — Daniel Shook
(74) *Attorney, Agent, or Firm* — Vierra Magen Marcus LLP

(57) ABSTRACT

Described herein are methods for fabricating a plurality of optoelectronic devices, and the optoelectronic devices resulting from such methods. One such method includes performing through silicon via (TSV) processing on a wafer, which includes a plurality of light detector sensor regions, to thereby form a plurality of vias, and then tenting and plating the vias and performing wafer back metallization. Thereafter, plurality of light source dies are attached to a top surface of the wafer, and a light transmissive material is then molded to encapsulate the light detector sensor regions and the light sensor dies therein. Additionally, opaque barriers including opaque optical crosstalk barriers are fabricated. Further, solder balls or other electrical connectors are attached to the bottom of the wafer. The wafer is eventually diced to separate the wafer into a plurality of optoelectronic devices.

20 Claims, 15 Drawing Sheets light source die light detector sensor area real estate for light source die attachment

Wire bond pad structure no longer needed.

light detector sensor area

TSVs 0.35 mm pitch 0.20 mm diameter solder ball on package bottom 0.1 mm all round

WAFER LEVEL OPTOELECTRONIC DEVICE PACKAGES AND METHODS FOR MAKING THE SAME

PRIORITY CLAIM

This application claims priority to U.S. Provisional Patent Application No. 62/148,575, filed Apr. 16, 2015, which is incorporated herein by reference in its entirety.

RELATED APPLICATIONS

This application is related to U.S. patent application Ser. No. 13/761,708, entitled WAFER LEVEL OPTOELECTRONIC DEVICE PACKAGES AND METHODS FOR MAKING THE SAME, filed Feb. 7, 2013, U.S. patent application Ser. No. 14/671,619, entitled WAFER LEVEL OPTOELECTRONIC DEVICE PACKAGES AND METHODS FOR MAKING THE SAME, filed Mar. 27, 2015, and U.S. patent application Ser. No. 14/748,904, entitled WAFER LEVEL OPTOELECTRONIC DEVICE PACKAGES WITH CROSSTALK BARRIERS AND METHODS FOR MAKING THE SAME, filed Jun. 24, 2015, each of which is incorporated herein by reference in its entirety.

BACKGROUND

FIG. 1 is a perspective view of an exemplary prior art optical proximity sensor 102 that includes a cover lid 122, which is shown as being removed. The sensor 102 includes a light source die 104 and a light detector die 106 spaced apart from on another and attached to a base substrate 108 (e.g., a printed circuit board (PCB)). The light source die 104 is encapsulated in a clear epoxy 114, and the light detector die 106 is separately encapsulated in a clear epoxy 116. There is a gap 112 between the clear epoxy 116 encasing the light detector die 106 and the clear epoxy 118 encasing the light source die 104, wherein the gap 112 accepts a crosstalk barrier 132 (that is part of the cover lid 122) when the cover lid 122 is attached to the substrate 108. The cover 122, which is likely made of metal, includes a window 124 for the light source die 104 and separate window 126 for the light detector die 126. The opaque crosstalk barrier 132 (integrally formed with or attached to the cover lid 122) is used to optically isolate the light source die 104 from the light detector die 106.

As can be appreciated from the exemplary prior art optical proximity sensor 102 described with reference to FIG. 1, current packaging of optical proximity sensors involve many components and many process steps, which increase the bill of materials, escalate manufacturing costs, increase cycle times, and incur high yield losses.

BRIEF DESCRIPTION OF THE DRAWINGS

FIGS. 3(a)-3(i), is used to illustrate the fabrication of optoelectronic devices according to certain embodiments of the present invention.

FIGS. 4(a)-4(d), is used to illustrate the fabrication of optical crosstalk barriers, specular reflection reducing shelves and peripheral optical barriers according to certain embodiments of the present invention.

DETAILED DESCRIPTION

Certain embodiments described below enable the entire processing of optical proximity sensor devices (which can also be used for ambient light sensing) to be performed at the wafer level, thereby reducing the bill of materials and providing high yield manufacturing, resulting in very low cost solutions. Beneficially, the final devices, which can more generally be referred to as optoelectronic devices, are about the size of the light detector dies themselves, resulting in significant miniaturization, making the devices well suited for handheld or other mobile applications.

In the embodiments described below, there is no need for a separate base substrate (e.g., a PCB substrate) to which are connected a light source die and a light detector die. Rather, the light source die is connected to the light detector die, such that the light detector die acts as the base for the finished optoelectronic device. This provides for a significant cost reduction over other proximity sensor devices. Additionally, this reduces the total package footprint to approximately that of the light detector die itself.

Figure 1:
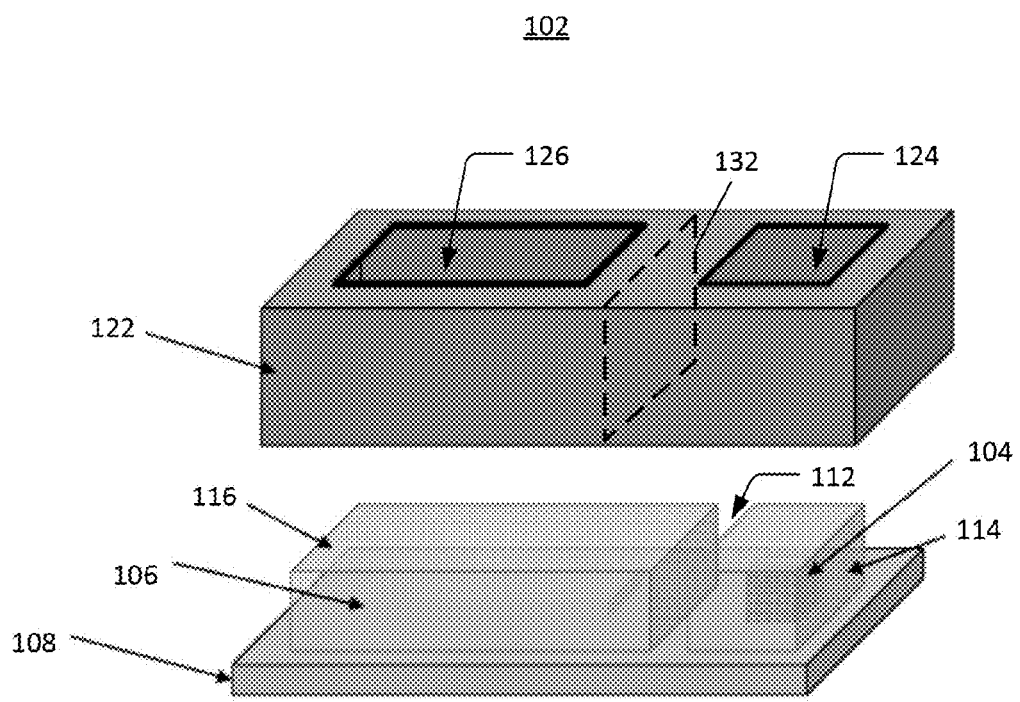
FIG. 1 is a perspective view of an exemplary prior art optical proximity sensor that includes a cover lid, which is shown as being removed.
Figure 2:
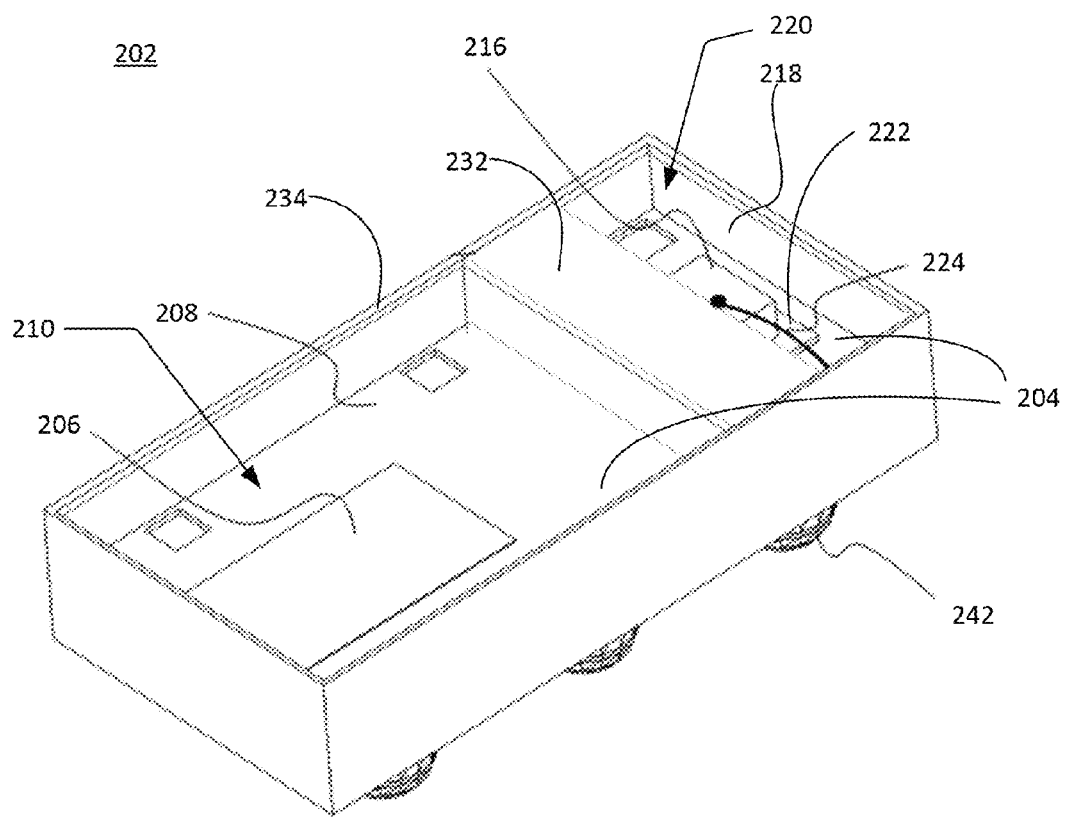
FIG. 2 is a perspective view of an optoelectronic device, according to an embodiment of the present invention, which can be an optical proximity sensor that can also provide ambient light sensing.

FIG. 2 is a perspective view of an optoelectronic device 202, according to an embodiment of the present invention, which can be an optical proximity sensor that can also provide ambient light sensing. As will be understood from the discussion of FIGS. 3-6, in accordance with specific embodiments of the present invention, each of the elements shown in FIG. 2 is either fabricated as part of a wafer, or attached to the wafer during wafer level processing, prior to dicing of the wafer.

Referring to FIG. 2, a light detector sensor region 206 is shown, which was formed within a portion of a wafer (also referred to as the light detector die 204) using any know or future developed wafer level device fabrication process and structure. For example, the light detector sensor region 206 can include an $N^+$ region, which is heavily doped, and a $P^-$ region (e.g., a $P^-$ epitaxial region), which is lightly doped, all of which is formed on a $P^+$ or $P^{++}$ substrate, which is heavily doped. The $N^+$ region and $P^-$ region form a PN junction, and more specifically, a $N^+/P^-$ junction. When this PN junction is reversed biased, e.g., using a voltage source, a depletion region is formed around the PN junction. When light is incident on the light detector sensor region 206, electron-hole pairs are produced in and near the diode depletion region. Electrons are immediately pulled toward $N^+$ region, while holes get pushed down toward $P^-$ region. These electrons (also referred to as carriers) are captured in $N^+$ region and produce a measurable photocurrent indicative of the intensity of the light. This is just one example of the structure of the light detector sensor region 206, which is not meant to be limiting. The light detector sensor region 206 can alternatively include a P+/N− junction, or a PIN, NPN, PNP or NIP junction, but is not limited thereto. Further, it is noted that the light detector sensor region 206 can be made up of a plurality of smaller light detector sensor regions connected together. Regardless of the exact structure of the light detector sensor region 206, the light detector sensor region 206 produces a signal (e.g., a photocurrent) in response to and indicative of incident light.

In certain embodiments the light detector sensor region 206 is covered by a light transmissive material 208, which can be, e.g., a light transmissive epoxy (e.g., a clear or tinted epoxy), or other light transmissive resin or polymer. In certain embodiments, the light transmissive material 208 may have a pigment or other property that filters out light of certain wavelengths that are not of interest, while allowing light of wavelengths of interest to pass. The optoelectronic device 202 is also shown as including a light source die 216 encapsulated within a light transmissive material 218, which is likely the same as the light transmissive material 208.

The light source die 216 includes a light emitting element, which can be a light emitting diode (LED), an organic LED (OLED), a bulk-emitting LED, a surface-emitting LED, a vertical-cavity surface-emitting laser (VCSEL), a superluminescent light emitting diode (SLED), a laser diode, or a pixel diode, but is not limited thereto. The light source die 216 includes at least an anode contact and a cathode contact. In accordance with certain embodiments, one of the anode and cathode contacts is located on the bottom of the light source die 216 and is connected to a bond pad on the top surface of the light detector die 204; and the other one of the anode and cathode contacts is located on the top surface of the light source die 216 and is connected by a bond wire 224 to a bond pad on the top surface of the light detector die 204. In alternative embodiments, both the anode and cathode contacts are located on the bottom of the light source die 216, and both the anode and the cathode contacts are connected directly to respective bond pads on the top surface of the light detector die 204, thereby eliminating the need for a bond wire. Further, it is noted that the light source die 216 can include a plurality of light emitting elements connected together, e.g., serially and/or in parallel.

The light detector die 204 can also include other circuitry, such as, a transimpedance amplifier that converts a current signal to a voltage signal, and/or amplifier circuitry that is used to amplify the photocurrent produced by the light detector sensor region 206, and/or driver circuitry that is used to selectively drive the light emitting element(s) of the light source die 216. It would also be possible for the driver circuitry to alternatively be part of the light source die 216, or to be external to the dies 204 and 216.

An opaque crosstalk barrier 232 is located between the light detector sensor region 206 and the light source die 216 to thereby optically isolate the light emitting element(s) of the light source die 216 from the light detector sensor region 206. The opaque crosstalk barrier 232 can be formed from an opaque material, which can be, e.g., a black or other dark epoxy, or other resin or polymer that is non-transmissive to the light generated by the light source die 216. The opaque material that forms the opaque crosstalk barrier 232 also forms a peripheral barrier 234 around the entire periphery of the device 202, so as to optically isolate the device 202 from one or more other optoelectronic device(s) that may be located in the vicinity of the device 202. In specific embodiments, the opaque crosstalk barrier 232 and peripheral barrier 234 is formed using an opaque molding compound.

A window 210 is located over the light detector sensor region 206, and a window 220 is located over the light source die 216. While the windows 210 and 220 are shown as being simple apertures or openings, more complex windows can be formed.

Figure 3:
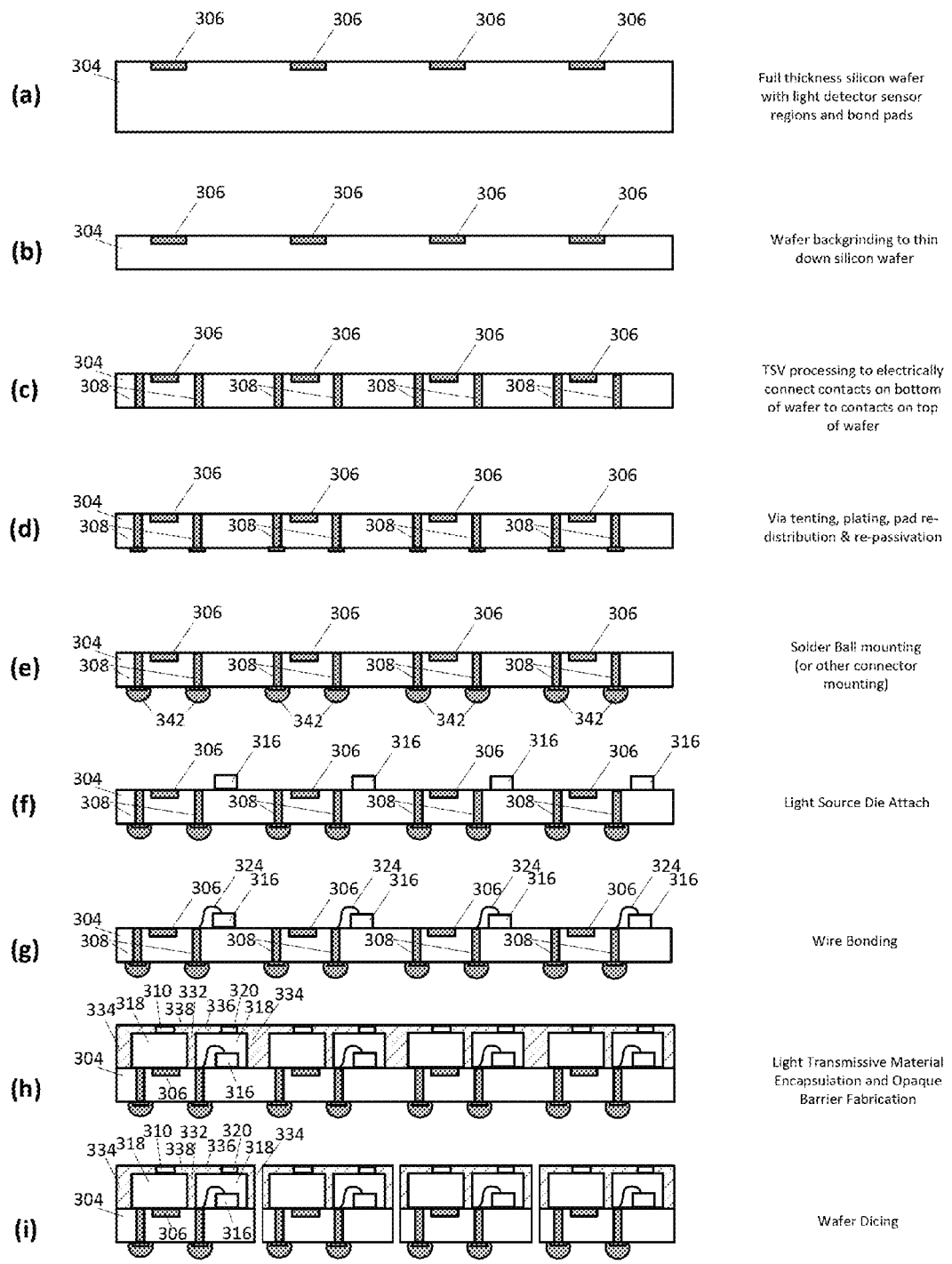
FIG. 3, which includes cross-sectional

FIG. 3, which includes cross-sectional FIGS. 3(a)-3(i), will now be used to illustrate the fabrication of an optoelectronic device (and more specifically, a plurality of such devices), according to certain embodiments of the present invention. For example, the process described with reference to FIG. 3 can be used to produce the optoelectronic device 202, described above with reference to FIG. 2.

Referring to 3(a), a plurality of light detector sensor regions 306, which can also be referred to as light detector sensor regions 306, are shown as being formed in a silicon wafer 304. Each of the light detector sensor regions 306 can include one or more PN, PIN, NPN, PNP or NIP junction(s), but is not limited thereto, as was described above with reference to the light detectors sensor region 206 in FIG. 2. In specific embodiments, each of the light detector sensor regions 306 is a CMOS image sensor fabricated using CMOS device fabrication. Additionally, while not specifically shown in FIG. 3(a), bond pads can also formed on a top surface of the silicon wafer 304, which can also be referred to herein simply as the wafer 304. For example, such bond pads can be for connecting anode and cathode contacts of light source dies to the wafer 304, as will be described in additional detail below.

Referring to FIG. 3(b), wafer backgrinding is performed to thin the wafer 304 to its final desired thickness. For example, the wafer may start out having a 30 mil thickness, and may end up with a thickness of about 5 mils after the backgrinding. This significantly reduces the thickness of the final devices. These are just exemplary initial and final wafer thicknesses, which are not meant to be limiting.

Referring to FIG. 3(c), through silicon via (TSV) processing is performed upward, from the bottom of the wafer 304, to form the vias 308 that will provide electrical connections between components connected to the top of the wafer 304 and the electrical contacts (e.g., solder balls) which will be formed on a bottom of the wafer 304. In other words, bottom-up TSV processing is performed on the wafer 304. For example, standard TSV processing with plasma etch can be used to form the openings (hole drilling). At this stage there is no plastic material deposited on the wafer. Accordingly, copper (Cu) seeding, Cu plating, via filling and chemical mechanical polishing/planarization (CMP) can be performed without process constraints.

Referring to FIG. 3(d), via plating and tenting is performed to electrically connect contacts on the bottom of the wafer 304 to contacts on the top of the wafer 304, and potentially within the wafer. Additionally, pad redistribution and re-passivation may be performed to relocate the final solder ball pads in an array and size that is different from that of the TSV vias. More generally, wafer back metallization can be performed to prepare the wafer for bottom terminal connections, including, but not limited to, pad redistribution.

Referring to FIG. 3(e), solder balls 342 are shown as being mounted to the bottom of the wafer 304. More specifically, the wafer 304 can be subjected to flux print, solder ball attachment and reflow to produce the solder ball terminals on the bottom of the wafer 304. It is also within the scope of the present invention for alternative electrical contacts to be used instead of solder balls. For example, electrically conductive lands, pads or pegs can be used. Laser markings can also be added to the bottom of the wafer 304.

Referring to FIG. 3(f), a plurality of light source dies 316 are connected to bond pads on the top surface of the wafer 304. For example, the wafer 304 can be loaded onto a die attachment machine and held in place by a wafer holder. The light source dies 316 can be attached, e.g., using an electrically conductive epoxy, such as, but not limited to, a silver (Ag) epoxy. This will connect either the anode or the cathode contact of the light emitting element(s) of each light source die 316 to a respective bond pad on the top surface of the wafer 304. If both the anode and the cathode contacts of the light source die are located on the bottom of the light source die, then both the anode and the cathode contacts can be connected directly to respective bond pads on the top surface of the wafer 304 by an electrically conductive epoxy. The wafer then goes through a baking process to cure the electrically conductive epoxy (e.g., the Ag epoxy).

Referring to FIG. 3(g), a wafer level bonding machine can then be used to connect a bond wire 324 from the other contact (e.g., the cathode or anode) of the light emitting element of each light source die 316 to a respective bond pad on the wafer 304. The bond wires 324 can be made, e.g., of silver (Ag) or copper (Cu), but are not limited thereto. This assumes that that one of the anode and cathode contacts is located on the bottom of the light source die 216, and the other one of the anode and cathode contacts is located on the top surface of the light source die 216. The need for bond wires 324 is eliminated if both the anode and cathode contacts are located on the bottom of the light source die 216.

Referring to FIG. 3(h), the top surface of the wafer 304 and the elements connected thereto, including the light source dies 316 (and the bond wires 324, if they are present) are encapsulated in a light transmissive material 318. The light detector sensor regions 306 are also encapsulated in the light transmissive material 318. The light transmissive material 318 can be, e.g., a light transmissive epoxy (e.g., a clear or tinted epoxy), or other light transmissive resin or polymer. In accordance with specific embodiments, the light transmissive material 318 is a clear solder mask material that is dispensed using solder mask deposition equipment. In accordance with alternative embodiments, the light transmissive material 318 (e.g., a clear epoxy) is formed using liquid compression molding, with or without vacuum assist. Alternatively, injection or transfer molding can be used.

Also shown in FIG. 3(h) are optical crosstalk barriers 332 that are used to block light from being transmitted directly from one of the light source dies 316 to an adjacent one of the light detector sensor regions 306. Also shown in FIG. 3(h) are specular reflection reducing shelves 336 that extend from each of the optical crosstalk barriers 332 towards an adjacent light source die 316. Additionally, specular reflection reducing shelves 338 extend horizontally from each of the optical crosstalk barriers 332 towards an adjacent light detector sensor region 306. Such shelves 336, 338 are used to reduce specular reflections that may occur if a light transmissive cover plate (e.g., made of glass, plastic, or some other protective light transmissive material) is placed over a finished optoelectronic device (e.g., optical proximity sensor). For example, such a cover plate can be the glass covering a screen of a mobile phone, portable music player or personal data assistant (PDA), or the plastic covering a screen of a laptop computer. When such a cover plate is placed over an optical proximity sensor, the optical proximity sensor is often susceptible to specular reflections. Just as it is desirable to minimize light being transmitted directly from a light source die 316 to an adjacent light detector sensor region 306, it is also desirable to minimize the specular reflections because such reflections similarly reduce the capability of the overall device to sense proximity or distance, since specular reflections are essentially noise that contain no information. Also shown in FIG. 3(h) are peripheral barriers 334 used to optically isolate the finished optoelectronic device (e.g., optical proximity sensor) from one or more other optoelectronic device(s) that may be located in the vicinity of the device.

Also shown in FIG. 3(h) are windows 310 that are left open over at least a portion of each of the light detector sensor regions 306, and windows 320 that are left open over at least a portion of each of the light source dies 316. The windows 320 over the light source dies 316 allow at least a portion of the light emitted the light emitting elements of the light source dies 316 to exit the devices, and the windows 310 over the light detector sensor regions 306 allow emitted light, reflected off objects within the fields of view of the devices, to be incident on and detected by the light detector sensor regions 306. If the devices are being used as ambient light sensors, the windows 310 over the light detector sensor regions 306 allow ambient light to be incident on and detected by the light detector sensor regions 306. Such windows 310, 320 can also be referred to as apertures.

Figure 4:
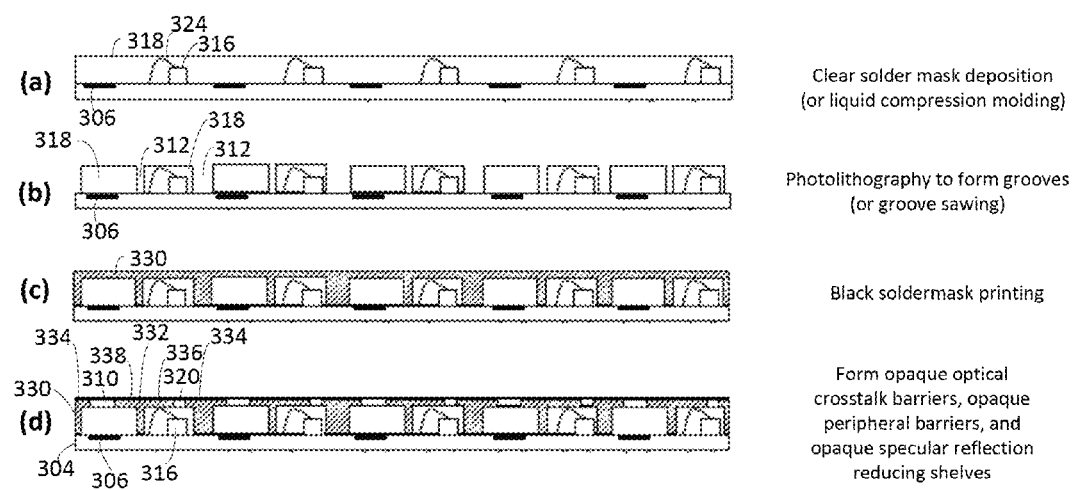
FIG. 4, which includes cross-sectional
Figure 5:
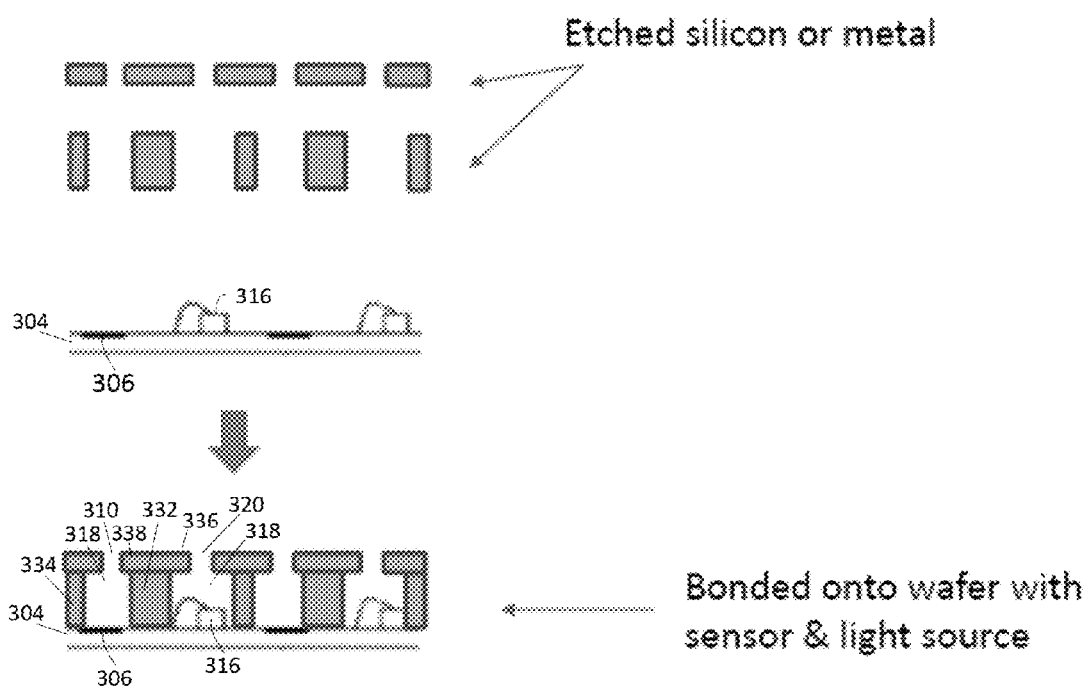
FIG. 5, which includes cross-sectional views, is used to illustrate the fabrication of optoelectronic devices according to alternative embodiments of the present invention.

Additional details of how to encapsulate the light detector sensor regions 306 and the light source dies 316 (and the bond wires 324, if they are present) in the light transmissive material 318, and how to fabricate the opaque vertical optical crosstalk barriers 332, the opaque horizontal shelves 336 (that extend from each of the vertical crosstalk barriers 332 towards an adjacent light source die 316), the opaque horizontal shelves 338 (that extend horizontally from each of the vertical crosstalk barriers 332 towards an adjacent light detector sensor region 306), and the opaque peripheral barriers 334, are described below with reference to FIGS. 4, 5A and 5B.

Referring to FIG. 3(i), the wafer is then mechanically diced (e.g., sawn) to singulate each optoelectronic device. In accordance with an embodiment, after the dicing, the devices remain attached to a tape (e.g., Mylar tape) medium used to mount the wafer. The singulated devices can then be tested using an electrical tester (e.g., a tester having probes) to check whether the individual devices are operating properly. Alternatively, the testing can be performed prior to the dicing. The singulated devices can then be loaded onto a pick and place machine that is used to pick the devices that operate properly (as determined using the testing) and place them into tape and reel packing, at which point they are ready for shipping to customers.

Still referring to FIG. 3, it is preferable to attach the light source dies 316 to the top of the wafer 304, as shown in FIG. 3(f), after the steps described with reference to FIGS. 3(a)-3

(e) are performed. This is because it is beneficial that the top of the wafer 304 is planar (without any topology) during the steps described with reference to FIGS. 3(a)-3(e). Otherwise, wafer mechanical integrity may be compromised. Further, it is beneficial to mold the light transmissive material 318 over the light source dies 316 and the light detector sensor regions 306 after wafer back metallization is performed in order to avoid potentially discoloring the light transmissive material 318 and/or causing other thermal issues that may be caused by the heat required to perform the wafer back metallization, which process typically has the highest thermal budget. It may also be beneficial to mold the light transmissive material 318 over the light source dies 316 and the light detector sensor regions 306 before the solder balls 342, or other electrical connectors, are mounted to the bottom of the wafer 304, in order to avoid potentially discoloring the light transmissive material 318 and/or causing other thermal issues that may be caused by the heat required to attach the solder balls 342 or other electrical contact terminals. However, since the heat required to attach solder balls (or other electrical connector) to the bottom of a wafer is less than the heat required for wafer back metallization, this is not as beneficial as performing wafer back metallization before molding the light transmissive material 318 over the light source dies 316 and the light detector sensor regions 306. Despite the aforementioned benefits, it is also within the scope of embodiments of the present invention to perform the steps described with reference to FIG. 3 in different orders than described above. For example, in an alternative embodiment, attachment of the light source dies 316 to the top of the wafer 304, as describe with reference to FIG. 3(f), can alternatively be performed between the steps described with reference to FIGS. 3(a) and 3(b), between the steps described with reference to FIGS. 3(b) and 3(c), between the steps described with reference to FIGS. 3(c) and 3(d), or between the steps described with reference to FIGS. 3(d) and 3(e). Other variations are also possible, and within the scope of embodiments described herein. For example, the mounting of the solder balls or other electrical connectors may be the last step that is performing prior to the mechanical dicing of the wafer to singulate each optoelectronic device.

FIG. 4, which includes cross-sectional FIGS. 4(a)-4(d), will now be used to described additional details of how to encapsulate the light detector sensor regions 306 and the light source dies 316 (and the bond wires 324, if they are present) in the light transmissive material 318, and how to fabricate the optical crosstalk barriers 332, the specular reflection reducing shelves 336 (that extend from each of the optical crosstalk barriers 332 towards an adjacent light source die 316), the specular reflection reducing shelves 338 (that extend horizontally from each of the optical crosstalk barriers 332 towards an adjacent light detector sensor region 306), and the peripheral barriers 334. The specular reflection reducing shelves 336 and the specular reflection reducing shelves 338, individually, or collectively, can be referred to as specular reflection reducing shelves. Referring to FIG. 4(a), the top surface of the wafer 304 and the elements connected thereto, including the light source dies 316 (and the bond wires 324, if they are present) are encapsulated in the light transmissive material 318. The light detector sensor regions 306 are also encapsulated in the light transmissive material 318. As noted above, the light transmissive material 318 can be, e.g., a light transmissive epoxy (e.g., a clear or tinted epoxy), or other light transmissive resin or polymer. In accordance with specific embodiments, the light transmissive material 318 is a clear solder mask material that is dispensed using solder mask deposition equipment. In accordance with alternative embodiments, the light transmissive material 318 (e.g., a clear epoxy) is formed using liquid compression molding, with or without vacuum assist. Alternatively, injection or transfer molding can be used.

Referring to FIG. 4(b), grooves 312 are formed in the light transmissive encapsulating material 318 to separate encapsulated light detector sensor regions 306 from adjacent encapsulated light source dies 316. In accordance with certain embodiments, photolithography is used to form the grooves 312. In accordance with other embodiments, the grooves 312 are cut, e.g., using a saw or a laser.

In the embodiment just described above with reference to FIGS. 4(a) and 4(b), the light detector sensor regions 306 and the light source dies 316 (and the bond wires 324, if they are present) are encapsulated in the light transmissive material 318 during one step, and then the grooves 312 are formed during a further step. These two steps can alternatively be replaced with a single step during which a mold is used to encapsulate the light detector sensor regions 306 and the light source dies 316 (and the bond wires 324, if they are present) in a light transmissive material 318, and to form the grooves 312. Such a mold would include mold features for forming the grooves at desired positions relative to the light detector sensor regions 306 and the light source dies 316. More specifically, during a single molding step, the light detector sensor regions (which can also be referred to a light detector sensor areas) and the light source dies (and the bond wires 324, if present) are encapsulated in a light transmissive material with grooves in the light transmissive material between the light detector sensor regions and adjacent light source dies. The result of such a molding step would resemble what is shown in FIG. 4(b).

Referring to FIG. 4(c), in accordance with certain embodiments, an opaque material 330 is dispensed over the remaining light transmissive material 318 and within the grooves 312 discussed with reference to FIG. 4(b). The opaque material 330 is used to form an optical crosstalk barrier 332 (between each light detector sensor region 306 and its adjacent light source die 316) and a peripheral barrier 334, the purposes of which were discussed above with reference to elements 232 and 234 in FIG. 2. The opaque material 330 can be, e.g., a black or other dark epoxy, or other resin or polymer that is non-transmissive to the light generated by the light source die 316. In specific embodiments, the opaque material is a black solder mask material that is dispensed using solder mask printing. Referring to FIG. 4(d), windows 310 are formed for the light detector sensor regions 306, and windows 320 are formed for the light source dies 316. In accordance with specific embodiments, these windows 310, 320, which can also be referred to as apertures, can be formed by removing portions of the opaque material 330 (e.g., black solder mask material) using photolithography.

In accordance with alternative embodiments, rather than performing the two steps described above with reference to FIGS. 4(c) and 4(d), a further molding step is used to fill the grooves 312 with an opaque material 330 to form vertical optical crosstalk barriers 332 between light source dies 316 and adjacent light detector sensor regions 306. The opaque material 330 can be, e.g., a black or other dark molding compound, epoxy, or other resin or polymer that is non-transmissive to the light generated by the light source dies 316. Compression molding, injection molding or transfer molding can be used, for example, to perform this molding step.

The vertical optical crosstalk barriers 332 are used to block light from being transmitted directly from one of the light source dies 312 to an adjacent one of the light detector sensor regions 306. During this molding step, shelves 336 that extend from each of the vertical crosstalk barriers 332 towards an adjacent light source die 316, are also formed. Additionally, shelves 338 that extend horizontally from each of the vertical crosstalk barriers 332 towards an adjacent light detector sensor region 306, can also be formed. Such horizontal shelves 336, 338 are used to reduce specular reflections that may occur if a light transmissive cover plate (e.g., made of glass, plastic, or some other protective light transmissive material) is placed over a finished optoelectronic device (e.g., optical proximity sensor). For example, such a cover plate can be the glass covering a screen of a mobile phone, portable music player or personal data assistant (PDA), or the plastic covering a screen of a laptop computer. When such a cover plate is placed over an optical proximity sensor, the optical proximity sensor is often susceptible to specular reflections. Just as it is desirable to minimize light being transmitted directly from a light source die 316 to an adjacent light detector sensor region 306, it is also desirable to minimize the specular reflections because such reflections similarly reduce the capability of the overall device to sense proximity or distance, since specular reflections are essentially noise that contain no information. The opaque material 330 can also be used to form a peripheral barrier 334 used to optically isolate the finished optoelectronic device (e.g., optical proximity sensor) from one or more other optoelectronic device(s) that may be located in the vicinity of the device. More generally, during a single molding step an opaque material 330 is molded to form the optical crosstalk barriers 332, the peripheral barriers 334, and the specular reflection reducing shelves 336, 338. During this same molding step, windows 310 are left open over at least a portion of each of the light detector sensor regions 306, and windows 320 are left open over at least a portion of each of the light source dies 316, as shown in FIG. 4(d).

In accordance with specific embodiments, the molding of the light transmissive material 318, performed to achieve what is shown in FIG. 4(b), and the molding of the opaque material 330, to achieve what is shown in FIG. 4(d), are performed using a dual molding process. For example, the dual molding process can be dual-shot injection molding, but is not limited thereto.

In alternative embodiments, the steps described above with reference to FIGS. 4(a) and 4(b), or the combination thereof, is/are eliminated. In other words, in such alternative embodiments, the light detector sensor regions 306 (which can also be referred to a light detector sensor areas) and the light source dies 316 (and the bond wires 324, if present) are not encapsulated in a light transmissive material.

In still other embodiments, the opaque barriers 332, 334 and the shelves 336, 338 are formed from the opaque material 330 prior to the light transmissive material 318 being used to encapsulate the light detector sensor regions 306 and the light source dies 316 (and the bond wires 324, if present).

After the above described wafer level processing, e.g., to form the light transmissive material and to form the opaque barriers, the wafer can be attached to a wafer support system e.g., using an acrylic based adhesive. The wafer support system will help prevent warping and help protect the light transmissive material 318 and the barriers from temperature excursions.

In accordance with certain embodiments of the present invention, rather than forming the optical crosstalk barriers 332, the peripheral barriers 334, and the opaque horizontal specular reflection reducing shelves 336, 338 "on-wafer", these elements are parts of a preformed opaque structure made "off-wafer" from an opaque material. For example, referring to FIG. 5, in accordance with specific embodiments, the opaque vertical optical crosstalk barriers, the opaque peripheral barriers and the opaque vertical shelves (to reduce specular reflections) are preformed "off-wafer", and then attached to the wafer. For a more specific example, a sheet of opaque material can be etched to produce the vertical optical crosstalk barriers "off-wafer" that are thereafter adhered to the wafer (before or after the light detectors and sources are encapsulated with a light transmissive material). A further sheet of opaque material can be etched to produce the specular reflection reducing small apertures/windows, and the further sheet of opaque material can adhered above/to the vertical optical crosstalk barriers to provide the specular reflection reducing vertical shelves, as can be appreciated from FIG. 5. In accordance with embodiments of the present invention, the sheets of opaque material can be sheets of metal, sheets of silicon, or sheets of glass coated with an opaque material or otherwise treated to be opaque, but are not limited thereto. The opaque vertical optical crosstalk barriers and opaque vertical shelves (to reduce specular reflections) that are preformed "off-wafer" can be attached to a wafer after the light detector sensor regions 306 and the light source dies 316 (and the bond wires 324, if present) are encapsulated in a light transmissive material. Alternatively, the opaque vertical optical crosstalk barriers and opaque vertical shelves (to reduce specular reflections) that are preformed "off-wafer" can be attached to a wafer wherein the light detector sensor regions 306 and the light source dies 316 (and the bond wires 324, if present) are not encapsulated in a light transmissive material. Thereafter, the light detector sensor regions 306 and the light source dies 316 (and the bond wires 324, if present) may, or may not (depending upon implementation) be encapsulated in a light transmissive material.

Elements are considered to be formed "on-wafer" if they are formed directly on the wafer, as opposed to being formed separate from the wafer and then attached to the wafer. Elements are considered to be formed "off-wafer" if they are formed separate from the wafer and then attached to the wafer. Elements are considered to be formed at the wafer level if they are added or attached to the wafer before the wafer is diced. Elements that are formed "on-wafer" and elements that are formed "off-wafer" are considered to be formed at the wafer level so long as they are added or attached to the wafer before the wafer is diced. In the embodiments described herein, the optical crosstalk barriers 332 and the peripheral barriers 334, which are formed at the wafer level (whether formed on-wafer or pre-formed off-wafer and then attached to the wafer prior to dicing), can also be referred to individually or collectively as opaque vertical optical barriers. Certain instances or portions of the opaque vertical optical barriers may function as the optical cross talk barriers 332, while others, or portions thereof, may function as the peripheral barriers 334. The specular reflection reducing shelves 336 and/or 338, because they extend in a horizontal direction relative to the opaque vertical optical barriers, can also be referred to as opaque horizontal optical barriers. Certain instances or portions of the opaque horizontal optical barriers may function as the specular reflection reducing shelves 336 or 338. A discussion of why specular reflections may occur, and the function of specular reflection reducing shelves 336 and 338, is provided below with reference to FIGS. 14A-14C.

Where a sheet of opaque material (e.g., a sheet of metal, a sheet of silicon, or a sheet of glass coated with an opaque material or otherwise treated to be opaque) is used to form the opaque optical crosstalk barriers and peripheral barriers, and a second sheet of opaque material (e.g., a sheet of metal, a sheet of silicon, or a sheet of glass coated with an opaque material or otherwise treated to be opaque) is used to form the opaque vertical shelves (to reduce specular reflections) and windows, these two sheets can be attached to one another off-wafer, and then attached to the wafer. Alternatively, the first sheet of opaque material in which the opaque optical crosstalk barriers and peripheral barriers are formed can be attached to the wafer, and then the second sheet opaque material in which the opaque vertical shelves (to reduce specular reflections) and windows are formed can be attached, above the first sheet, to the wafer.

Figure 6A:
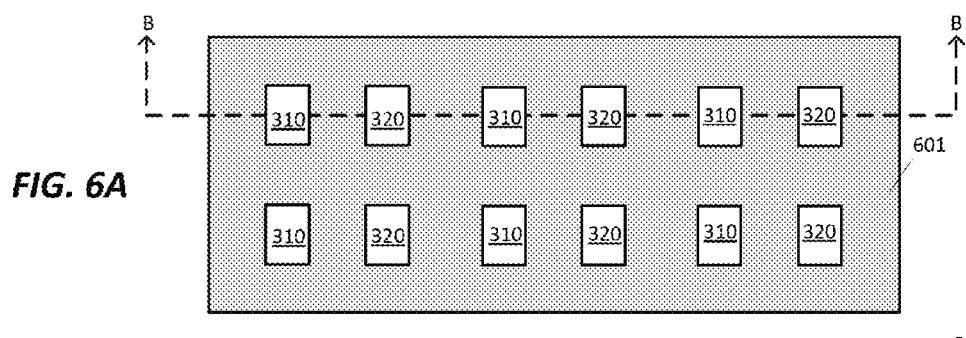
FIGS. 6A-6F are used to describe details of how to preform, off-wafer, opaque vertical optical crosstalk barriers, opaque peripheral barriers and opaque vertical shelves (to reduce specular reflections) from sheets of opaque material.
Figure 6B:
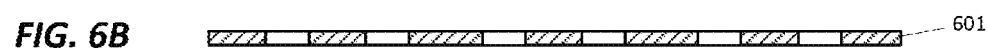

FIGS. 6A-6F will now be used to describe additional details of how to preform, off-wafer, the opaque vertical optical crosstalk barriers, the opaque peripheral barriers and the opaque vertical shelves (to reduce specular reflections) from sheets of opaque material. In other words, FIGS. 6A-6F are used to describe specific embodiments for forming opaque vertical optical barriers and opaque horizontal optical barriers off-wafer, at the wafer level. Referring to FIG. 6A, illustrated therein is a top view of a portion of a sheet of opaque material 601, with openings corresponding to the desired sizes of the apertures 310 and 320 etched in the sheet of opaque material 601. As mentioned above, the sheet of opaque material 601 can be a sheet of metal, or a sheet of silicon treated to be opaque, but is not limited thereto. FIG. 6B illustrates a side cross-sectional view of the portion of the sheet of opaque material 601 shown in FIG. 6A, along the dashed line B-B in FIG. 6A. The etched sheet of opaque material 601 shown in FIGS. 6A and 6B is used to form opaque horizontal optical barriers, as can be appreciated from FIG. 6F discussed below.

Figure 6C:
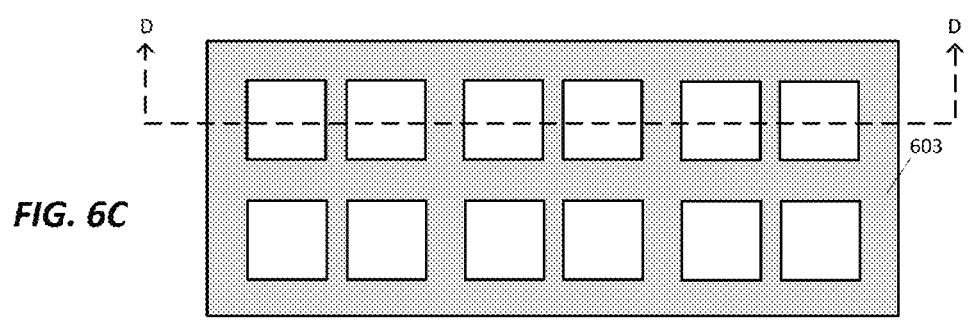
Figure 6D:
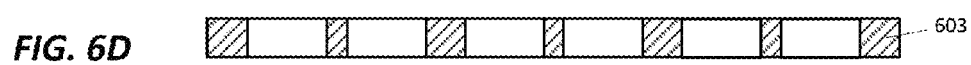

FIG. 6C illustrates a top view of a portion of a further etched sheet of opaque material 603, which can be a sheet of metal, or a sheet of silicon treated to be opaque, but is not limited thereto. FIG. 6D illustrates a side cross-sectional view of the portion of the sheet of opaque material 603 shown in FIG. 6C, along the dashed line D-D in FIG. 6C. The etched sheet of opaque material 603 shown in FIGS. 6C and 6D is used to form opaque vertical optical barriers, as can be appreciated from FIG. 6F discussed below.

Figure 6E:
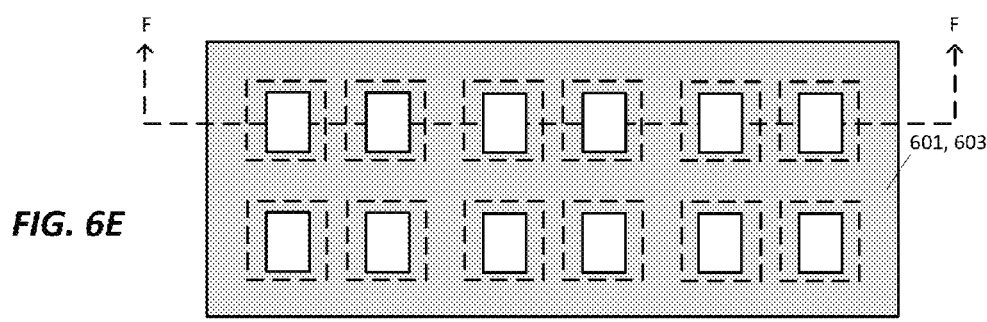
Figure 6F:

FIG. 6E illustrates a top view of an opaque structure formed by attaching the etched sheet of opaque material 601 above the etched sheet of opaque material 603, e.g., using an opaque epoxy. FIG. 6F illustrates a side cross-sectional view of the portions of the sheets of opaque material 601, 603 shown in FIG. 6E, along the dashed line F-F in FIG. 6E. As shown in FIG. 6F, the etched sheet of opaque material 601 is used to form opaque horizontal optical barriers, including the shelves 336 and 338 that are used to reduce specular reflections. As also shown in FIG. 6F, the etched sheet of opaque material 603 is used to form opaque vertical optical barriers, including the optical crosstalk barriers 332 and the peripheral barriers 334. In view of the above description, the structure shown in FIG. 6F can be referred to as a preformed opaque structure 605 that is made off-wafer.

Figure 7:
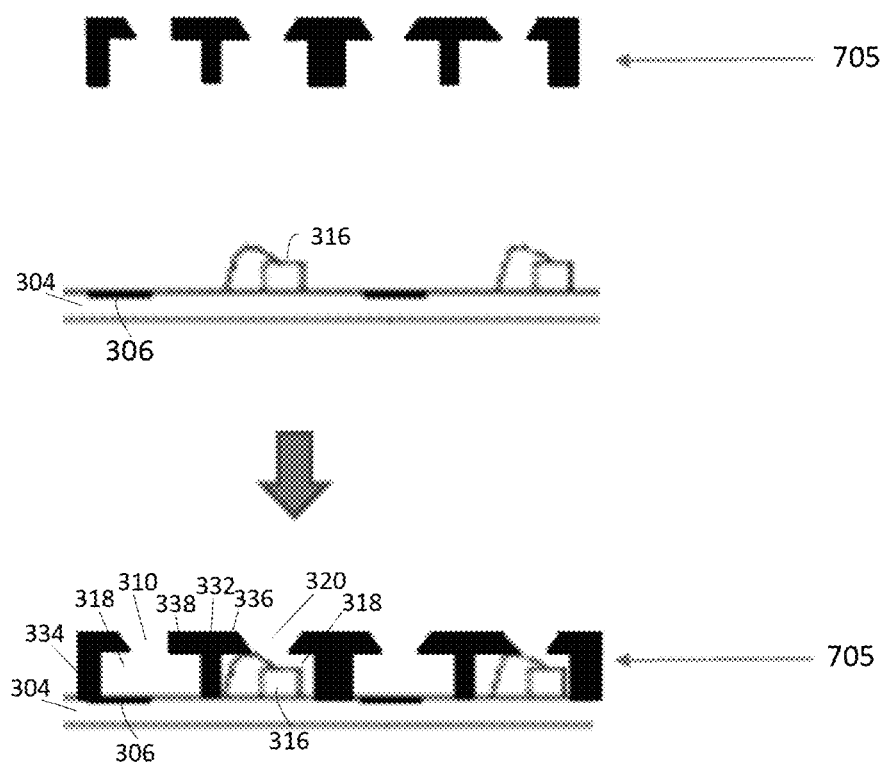
FIG. 7 illustrates the fabrication of optical crosstalk barriers, specular reflection reducing shelves and peripheral optical barriers according to alternative embodiments of the present invention.

FIG. 7 illustrates another example of preformed opaque structure 705 that is made off-wafer. Referring to FIG. 7, in this embodiment, an opaque molding compound is molded (e.g., injection, compression or transfer molded) to simultaneously form the optical crosstalk barriers 332, the peripheral barriers 334, and the opaque horizontal specular reflection reducing shelves 336 and/or 338 "off-wafer", and the preformed opaque structure 705 is thereafter adhered to the wafer after light detector sensor regions 306 and the light source dies 316 (and the bond wires 324, if present) are encapsulated with a light transmissive material. The opaque molding compound can be, for example, an opaque liquid crystal polymer, polyphthalamide (PPA) or other high temperature thermo-plastic materials, but is not limited thereto.

The optical crosstalk barriers 332, the peripheral barriers 334, and the specular reflection reducing shelves 336 and/or 338 can alternatively be adhered onto the wafer without the light detector sensor regions 306 and the light source dies 316 (and the bond wires 324, if present) being encapsulated with a light transmissive material. The optical crosstalk barriers 332, the peripheral barriers 334, and the specular reflection reducing shelves 336 and/or 338 can be made to the size of the wafer with a single pass attach or fabricated in smaller segments and attached via multiple passes onto the wafer.

Figure 8:
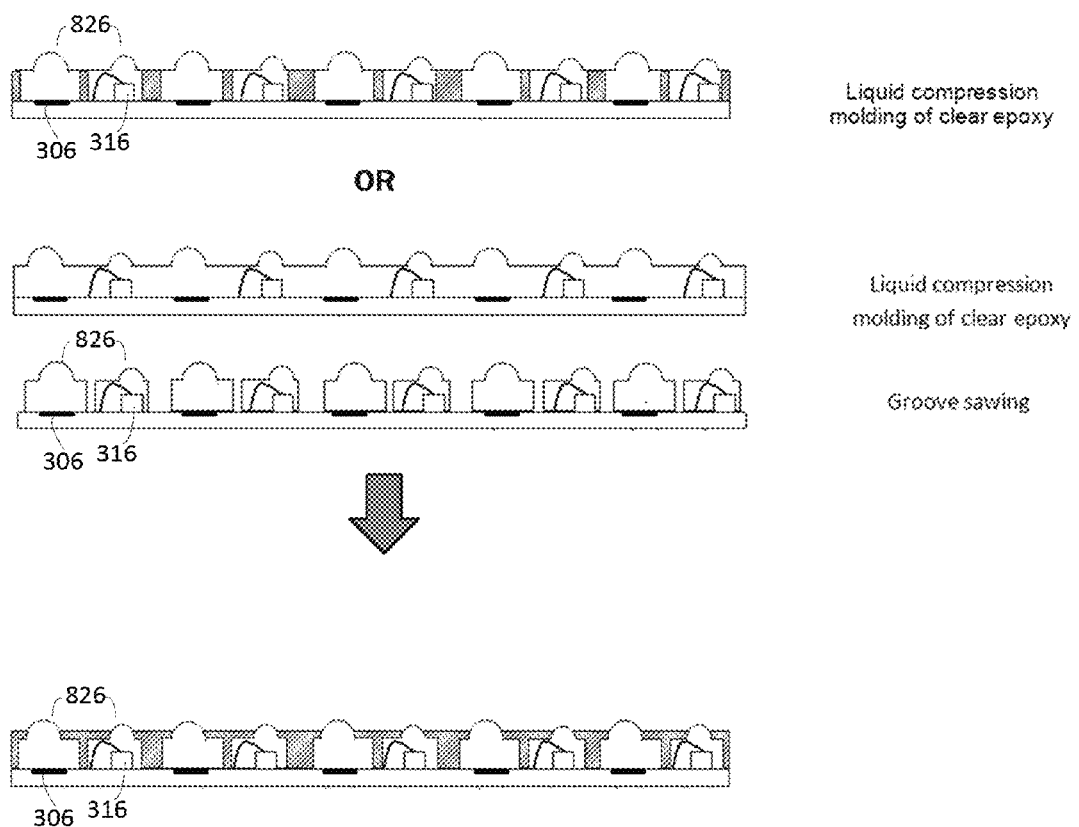
FIG. 8 illustrate that lenses, e.g., bubble lenses, can be formed over the light detector sensor regions and/or the light source dies, in accordance with certain embodiments.

In certain embodiments, lenses, e.g., bubble lenses, can be formed over the light detector sensor regions and/or the light source dies, as can be appreciated from FIG. 5C. Referring to FIG. 8, such lenses 826 can be formed, e.g., using liquid compression molding of the light transmissive material 318 (e.g., a clear epoxy). The lens over each light source die is used to focus light being emitted from the light source die. The lens over each light detector sensor region is used to focus light (reflected and/or ambient light) that is incident on the lens.

In the embodiments described above, there is no need for a separate base substrate (e.g., a PCB substrate) to which are connected a light source die and a light detector die. Rather, the light source die is connected to the light detector die, such that the light detector die acts as the base for the finished optoelectronic device. This provides for a significant cost reduction over other proximity sensor devices. Additionally, this reduces the total package footprint to approximately that of the light detector die itself. The resulting optoelectronic device(s) can be used for proximity detection, as well as for ambient light detection.

In accordance with specific embodiments described above, only a single bond wire is needed for each optical proximity sensor device. The rest of the electrical connections are routed by vias to the back of the die and finished with solder balls or other external connectors. This allows for package miniaturization. Additionally, the bill of materials is less prone to increase if the price of commodities used to produce bond wires (such as silver (Ag) or copper (Cu)) increase. In other embodiments, bond wires are not needed, as explained above.

In specific embodiments, the components of the optoelectronic devices are formed using wafer level chip scale packaging (CSP), which provides for extensive miniaturization.

Figure 9A:
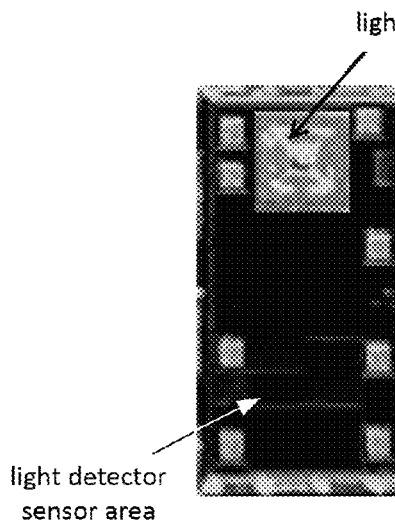
FIG. 9A illustrates a top view of an optoelectronic device according to an embodiment of the present invention.
Figure 9B:
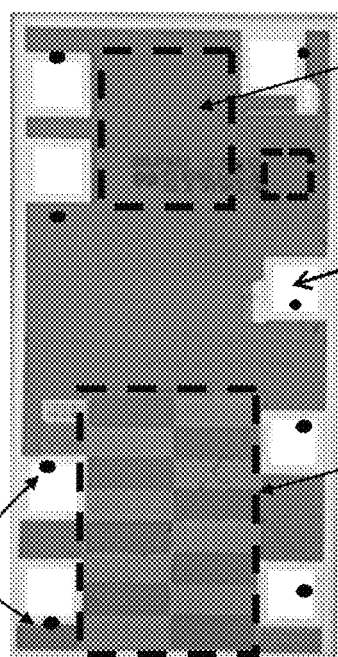
FIG. 9B illustrates a top view of the optoelectronic device of FIG. 9A, with the light source die removed.
Figure 9C:
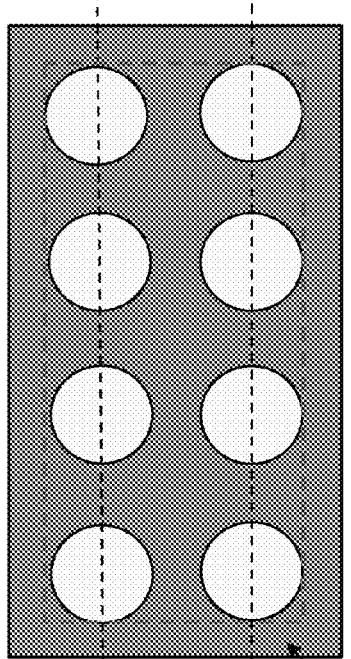
FIG. 9C illustrates a bottom view of the optoelectronic device of FIG. 9A.

Embodiments described above can be used to fabricate a plurality of optoelectronic devices which are optical proximity sensors. Such optical proximity sensors may also be able to function as ambient light sensors. Embodiments described herein can also be used to fabricate a plurality of optoelectronic devices which are ambient light sensors that are not configured to also function as optical proximity sensors. In such latter embodiments, where dedicated ambient light sensors are fabricated, light source dies are not attached to the wafer FIG. 9A illustrates a top view of an optoelectronic device according to an embodiment of the present invention. FIG. 9B illustrates a top view of the optoelectronic device of FIG. 9A, with the light source die removed. FIG. 9B illustrates a bottom view of the optoelectronic device of FIG. 9A.

Figure 10:
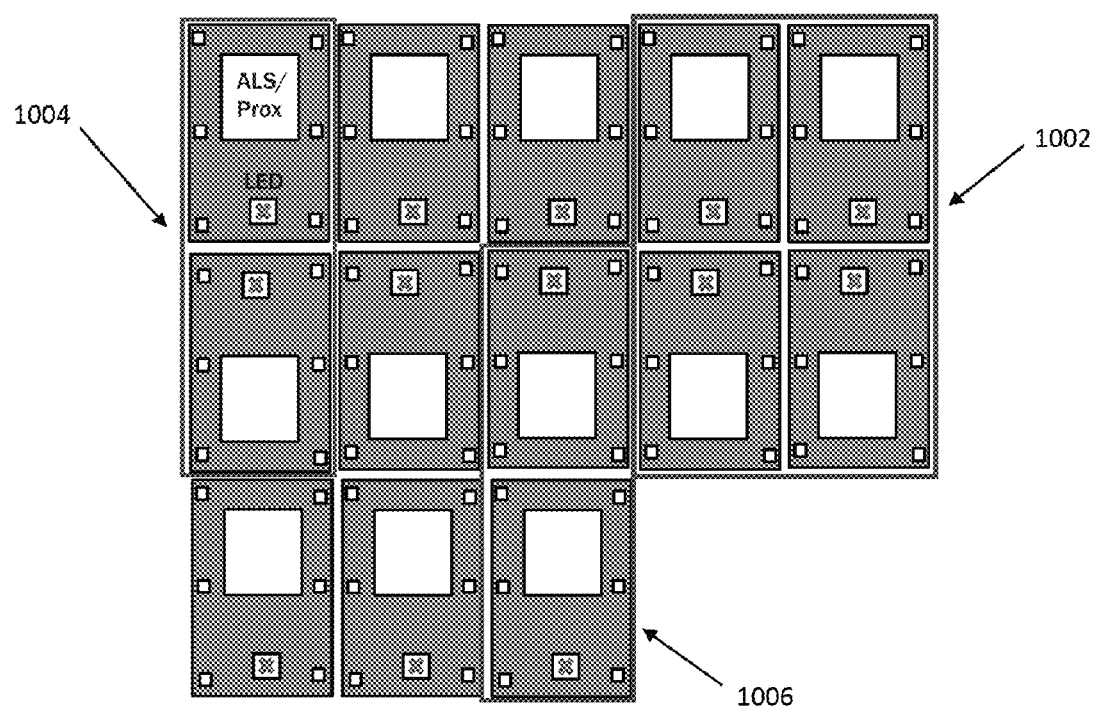
FIG. 10 is used to illustrate that in accordance with certain embodiments, dicing can be performed so that an array of sensors is included in a single package.

In accordance with certain embodiments, rather than performing the dicing so that each resulting device only includes a single proximity sensor, the dicing can alternatively be performed so that an array of such sensors is included in a single package, as can be appreciated from FIG. 10. More specifically, FIG. 10 shows an array of four optoelectronic devices in one package 1002, an array of two optoelectronic devices 1004 where the light source dies are spaced close to one another, and an array of two optoelectronic devices 1006 where the light source dies are spaced farther apart from one another. Other configurations are also possible.

Figure 11:
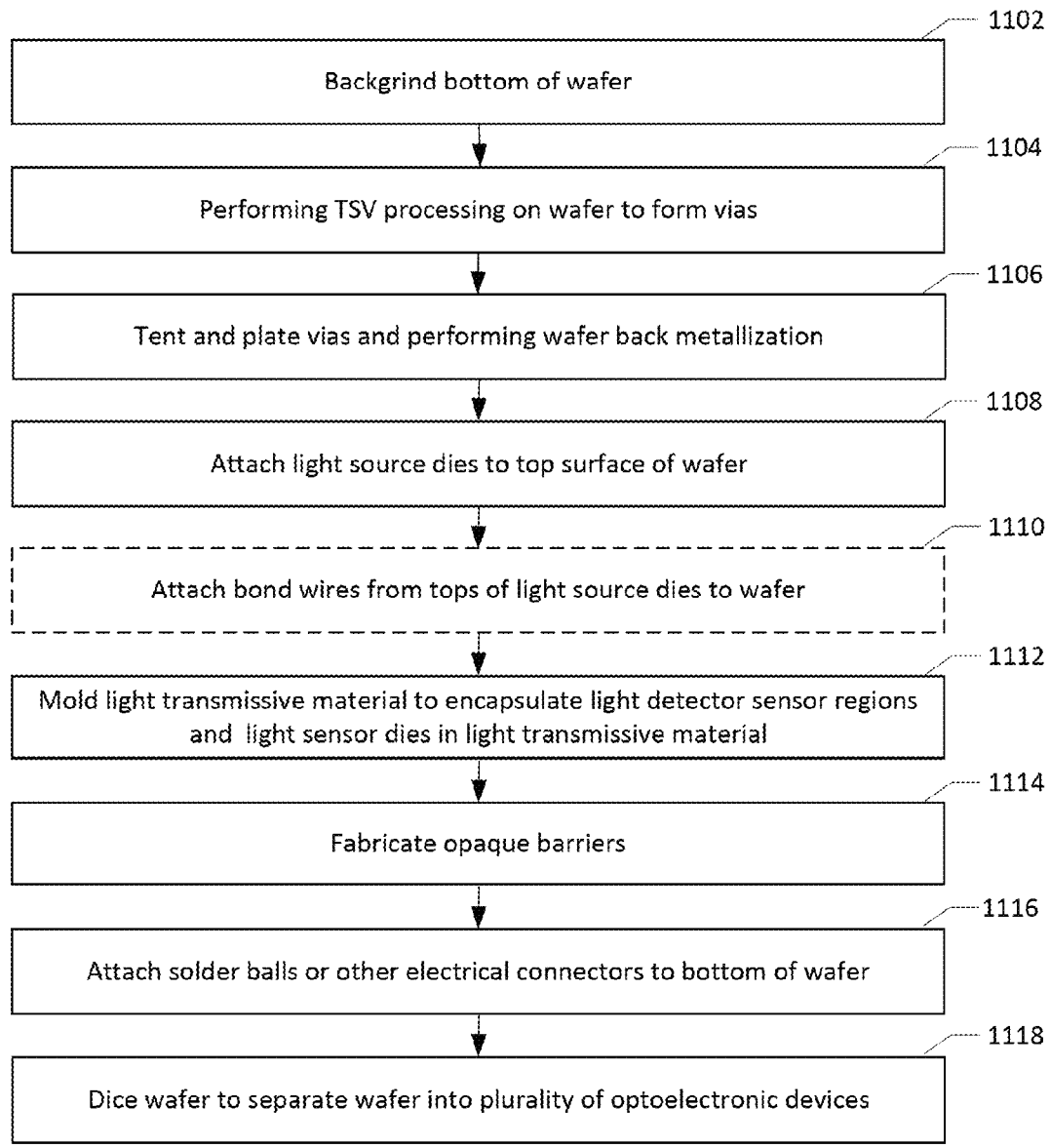
FIG. 11 is a high level flow diagram that is used to summarize methods for fabricating a plurality of optoelectronic devices, according to certain embodiments of the present invention.

FIG. 11 is a high level flow diagram that is used to summarize methods for fabricating a plurality of optoelectronic devices, according to certain embodiments of the present invention, starting with a wafer that includes a plurality of light detector sensor regions (e.g., 306). Referring to FIG. 11, step 1102 involves backgrinding a bottom of the wafer, which includes the plurality of light detector sensor regions, to achieve a specified thickness for the wafer. Step 1104 involves performing through silicon via (TSV) processing on the wafer to thereby form a plurality of vias. Step 1106 involves tenting and plating the vias and performing wafer back metallization, after performing the TSV processing.

The backgrinding (performed at step 1102) can be performed before or after the TSV processing (performed at step 1104), depending upon implementation. In accordance with certain embodiments, if the backgrinding is performed after the TSV processing, then tenting and plating the vias and performing wafer back metallization will be done after the backgrinding.

In accordance with specific embodiments, where the TSV processing (at step 1104) is performed after backgrinding the bottom of the wafer (at step 1102), the TSV processing (at step 1104) is bottom-up TSV processing, as described above with reference to FIG. 3(c). Performing TSV processing on a thin backgrinded wafer improves process capability, cost and cycle time due to a lower via depth requirement. This option also allows TSV processing to be decoupled from a CMOS sensor device fabrication process (used to form the light detector sensor regions) and to be fully completed using a different process capability and manufacturing site than the CMOS device fabrication site to leverage better cost structure and manufacturing flow.

Still referring to FIG. 11, step 1108 involves attaching each of a plurality of light source dies (e.g., 316) to a top surface of the wafer, e.g., as described above with reference to FIG. 3(f). More specifically, step 1108 can include attaching each of the light source dies to a separate bond pad on a top surface of the wafer. At step 1110, for each of the plurality of light source dies, a bond wire (e.g., 324) can be attached from a top of the light source die to a further separate bond pad on the top surface of the wafer. Alternatively, if the bottoms of the light source dies include both anode and cathode contacts, then both the anode and the cathode contacts can be connected directly to respective bond pads on the top surface of the wafer at step 1108. In other words, step 1110 can be eliminated if both anode and cathode contacts are located on the bottoms of the light source dies.

Step 1112 involves molding a light transmissive material (e.g., 318) to encapsulate the light detector sensor regions and the light sensor dies in the light transmissive material. More generally, step 1112 involves encapsulating the light detector sensor regions and the light sensor dies in a light transmissive material. The light transmissive material can be, e.g., a light transmissive epoxy (e.g., a clear or tinted epoxy), or other light transmissive resin or polymer. In accordance with specific embodiments, the light transmissive material is a clear solder mask material that is dispensed using solder mask deposition equipment. In accordance with alternative embodiments, the light transmissive material (e.g., a clear epoxy) is formed using liquid compression molding, with or without vacuum assist. Alternatively, injection or transfer molding can be used, as was noted above.

In accordance with specific embodiments, molding the light transmissive material to encapsulate the light detector sensor regions and the light sensor dies in the light transmissive material (at step 1112), is performed after tenting and plating the vias and performing wafer back metallization (at step 1106), and after attaching the plurality of light source dies to the top surface of the wafer (at step 1108). A benefit of molding the light transmissive material to encapsulate the light detector sensor regions and the light sensor dies in the light transmissive material, after tenting and plating the vias and performing wafer back metallization, is that it avoids potentially discoloring the light transmissive material and/or causing other thermal issues that may be caused by the heat generated during wafer back metallization, which process typically utilizes the highest temperature and has the highest thermal impact.

Still referring to FIG. 11, step 1114 involves fabricating opaque barriers including opaque optical crosstalk barriers (e.g., 332). In accordance with specific embodiments, step 1114 also includes fabricating opaque specular reflection reducing shelves (e.g., 336 and/or 338) and opaque peripheral barriers (e.g., 334). In accordance with certain embodiments, the opaque optical crosstalk barriers, the specular reflection reducing shelves and the opaque peripheral barriers are fabricated by molding an opaque material to produce such barriers. In certain such embodiments, a dual molding process, such as, but not limited to, dual-shot injection molding, is used to mold of the light transmissive material to encapsulate the light detector sensor regions and the light sensor dies in the light transmissive material (at step 1112), and to mold an opaque material to produce the opaque optical crosstalk barriers, reflection reducing shelves and peripheral barriers (at step 1114).

In accordance with alternative embodiments, the fabricating opaque optical crosstalk barriers, specular reflection reducing shelves and peripheral barriers, at step 1114, involves attaching preformed opaque optical crosstalk barriers, specular reflection reducing shelves and peripheral barriers to the wafer, e.g., as was described above with reference to FIGS. 5-7. More generally, additional details of the opaque barriers that can be fabricated at step 1114 were discussed above with reference to FIGS. 2-7, and are also discussed below with reference to FIGS. 14A-14C.

In accordance with specific embodiments, the through silicon via (TSV) processing performed on the wafer (at step 1106), and the tenting and plating the vias and performing wafer back metallization (at step 1106), are both performed before attaching the light source dies to the top surface of the wafer (at step 1108), and before molding the light transmissive material to encapsulate the light detector sensor regions and the light sensor dies in the light transmissive material (at step 1112). A benefit of performing the TSV processing and performing the tenting and plating the vias and wafer back metallization, before the attaching the light source dies to the top surface of the wafer, and before molding the light transmissive material to encapsulate the light detector sensor regions and the light sensor dies in the light transmissive material, is that the tenting and plating of the vias and the wafer back metallization (which can include, e.g., copper (Cu) seeding, Cu plating and chemical mechanical polishing/planarization (CMP)) can be performed without process constraints, because at this stage there is light transmissive material on the wafer.

In accordance with certain embodiments, the attaching of the light source dies to the top surface of the wafer (at step 1108), is performed after performing the backgrinding (at step 1102), after performing the TSV processing on the wafer (at step 1104), and after tenting and plating the vias and the performing wafer back metallization (at step 1106). A benefit of attaching the light source dies to the top surface of the wafer after performing the backgrinding, after performing the TSV processing on the wafer, and after tenting and plating the vias and performing wafer back metallization, is that it is better to perform the aforementioned steps while the top of the wafer is planar (without any topology). Otherwise, wafer mechanical integrity may be compromised. This is because the attachment of light source dies and the light transmissive material encapsulation of the wafer top side may lead to a non-planar and/or soft surface which may lead to wafer breakage during the mechanical grinding of the wafer back surface, if the wafer grinding were instead performed after the aforementioned steps.

Step 1116 involves mounting solder balls or other electrical connectors to the bottom of the wafer. For example, electrically conductive lands, pads or pegs can be used as electrical connectors, instead of solder balls. In accordance with certain embodiment, the solder balls or other electrical connectors are attached to the bottom of the wafer (at step 1116) after molding the light transmissive material to encapsulate the light detector sensor regions and the light sensor dies in the light transmissive material (at step 1112). In accordance with alternative embodiments, the solder balls or other electrical connectors are attached to the bottom of the wafer (at step 1116) before molding the light transmissive material to encapsulate the light detector sensor regions and the light sensor dies in the light transmissive material (at step 1112). Accordingly, depending upon implementation, the steps described with reference to FIG. 11 may be performed in the order shown therein, or in alternative orders, many of which are described herein.

A benefit to attaching the solder balls or other electrical connectors to the bottom of the wafer (at step 1116) before molding the light transmissive material to encapsulate the light detector sensor regions and the light sensor dies in the light transmissive material (at step 1112) is that performing the steps in this order would avoid potentially discoloring the light transmissive material (e.g., 318) and/or causing other thermal issues that may be caused by the heat required to attach the solder balls (e.g., 342) or other electrical contact terminals. However, since the heat required to attach solder balls (or other electrical connector) to the bottom of a wafer is less than the heat required for wafer back metallization, this is not as beneficial as performing wafer back metallization before molding the light transmissive material (e.g., 318) over the light source dies (e.g., 316) and the light detector sensor regions (e.g., 306).

Still referring to FIG. 11, step 1118 involves dicing the wafer to separate the wafer into a plurality of optoelectronic devices. In accordance with certain embodiments, each of the optoelectronic devices, resulting from dicing the wafer, includes at least one of the light detector sensor regions (e.g., 306), at least one of the light source dies (e.g., 308), one of the opaque optical crosstalk barriers (e.g., 332) between the at least one of the light detector sensor regions and the at least one of the light source dies, and at least two of the solder balls or other electrical connectors (e.g., 342).

The opaque barriers that are fabricated at step 1114 can be formed on-wafer, e.g., as described above with reference to FIGS. 3 and 4. Alternatively, the opaque barriers that are fabricated at step 1114 can be preformed off-wafer, e.g., as described above with reference to FIGS. 5-7. For example, as was described above with reference to FIG. 7, the opaque barriers can be molded off-wafer, and then attached to the wafer. Alternatively, as was described above with reference to FIGS. 6A-6F, and summarized below with reference to FIG. 12, the opaque barriers can be a preformed opaque structure made-off wafer from one or more etched sheets of opaque material. As noted above, in certain embodiments a preformed opaque structure, which is made off-wafer from an opaque material, includes opaque vertical optical barriers and opaque horizontal optical barriers. In specific embodiments, the opaque vertical optical barriers and the opaque horizontal optical barriers are made from two etched sheets of opaque material. The high level flow diagram of FIG. 12 will now be used to describe a method for forming, off-wafer, such a preformed structure, and attaching the structure to a wafer.

Figure 12:
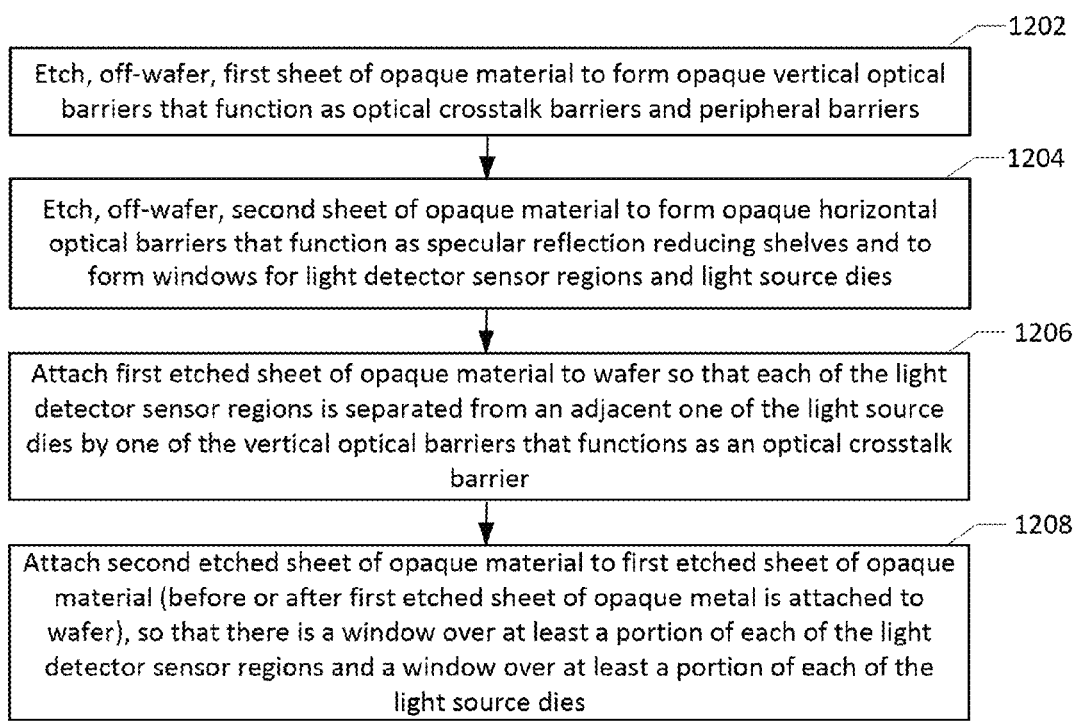
FIG. 12 is a high level flow diagram that is use to describe a method for forming, off-wafer, a preformed structure from an opaque material and attaching the structure to a wafer.

Referring to FIG. 12, step 1202 involves etching, off-wafer, a first sheet of opaque material to form the opaque vertical optical barriers that function as optical crosstalk barriers and peripheral barriers. Step 1204 involves etching, off-wafer, a second sheet of opaque material to form the opaque horizontal optical barriers that function as specular reflection reducing shelves and to form windows for the light detector sensor regions and the light source dies. Step 1206 involves attaching the first etched sheet of opaque material to the wafer so that each of the light detector sensor regions is separated from an adjacent one of the light source dies by one of the vertical optical barriers that functions as an optical crosstalk barrier. Step 1208 involves attaching the second etched sheet of opaque material to the first etched sheet of opaque material (before or after the first etched sheet of opaque metal is attached to the wafer), so that there is a window over at least a portion of each of the light detector sensor regions and a window over at least a portion of each of the light source dies. In certain embodiments, the first and second sheets of opaque material are both sheets of metal. In other embodiments, the first and second sheets of opaque material are both sheets of silicon. In other embodiments, the first and second sheets of opaque material are both sheets of glass coated with an opaque material or otherwise treated to be opaque. It would also be possible for one of the first and second sheets of opaque material to be a sheet of metal, and the other one of the first and second sheets of opaque material to be a sheet of silicon or a sheet of glass treated to be opaque. More generally, the first and second sheets of opaque material may be sheets of the same type of opaque material, or the types of the first and second sheets of opaque material may differ from one another. Exemplary additional details of the steps described in FIG. 12 can be appreciated from the above discussion of FIGS. 6A-6F.

In alternative embodiments, the preformed opaque structure is molded (e.g., injection molded, compression molded or transfer molded) from an opaque molding compound. The opaque molding compound can be, e.g., an opaque liquid crystal polymer, polyphthalamide (PPA) or some other high temperature thermo-plastic materials, but is not limited thereto. Exemplary additional details of how the preformed opaque structure can be molded, off-wafer, from an opaque molding compound and then attached to the wafer can be appreciated from the above discussion of FIG. 7.

In certain embodiments, the encapsulating the light detector sensor regions and the light sensor dies in the light transmissive material is at a time that is prior to the attaching the preformed opaque structure. As shown, e.g., in FIG. 3(*e*), grooves (e.g., 312) can be formed in the light transmissive material (e.g., 318) between the light detector sensor regions and adjacent light source dies. The light detector sensor regions and the light source dies (and the bond wires, if present) can first be encapsulated in a light transmissive material, and then the grooves can be molded/formed, as was described above with reference to FIGS. 3(*d*) and 3(*e*). Alternatively, the light detector sensor regions and the light source dies (and the bond wires, if present) can be encapsulated in a light transmissive material simultaneously with the grooves being formed, as was described above with reference to FIG. 3(e). Other variations are also possible and with the scope of embodiments of the present invention.

Figure 13:
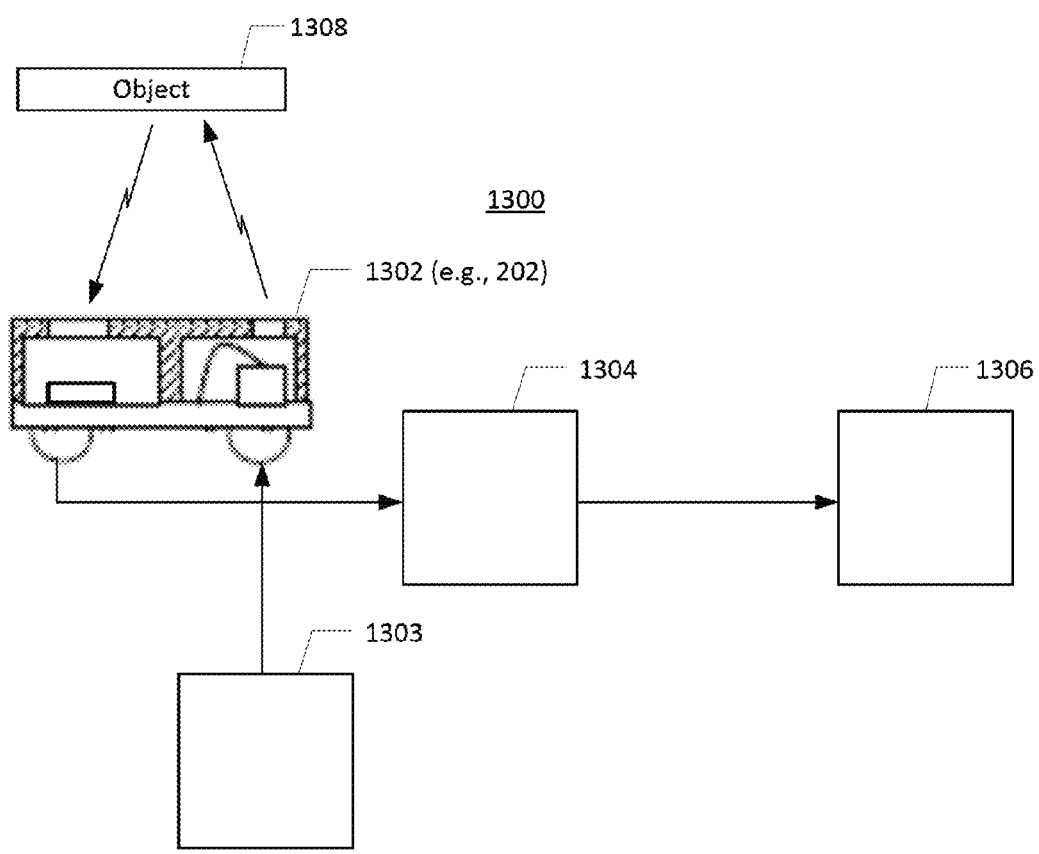
FIG. 13 is a high level block diagram of a system according to an embodiment of the present invention.

Optoelectronic devices of embodiments of the present invention can be used in various systems, including, but not limited to, mobile-phones and other handheld-devices. Referring to a system 1300 of FIG. 13, for example, an optoelectronic device 1302 (e.g., 202) can be used to control whether a subsystem 1306 (e.g., a touch-screen, backlight, virtual scroll wheel, virtual keypad, navigation pad, etc.) is enabled or disabled. For example, the optoelectronic device 1302 can detect when an object 1308, such as a person's finger, is approaching, and based on the detection either enable or disable the subsystem 1306. More specifically, a driver 1303 selectively drives a light source die (e.g., 216) of the optoelectronic device 1302, thereby causing the light source die to emit light that reflects off of the object 1308. The driver 1303 can be external to the device 1302, as shown, or part of the device 1302 (e.g., part of one of the dies of the device 1302). A portion of the reflected light is detected by a light detector sensor region (e.g., 306) of a light source die of the optoelectronic device 1302. An output of the optoelectronic device 1302 is provided to a comparator or processor 1304 which can compare the output of the optoelectronic device 1302 to a threshold, to determine whether the object 1308 is within a range where the subsystem 1306 should be enabled or disabled, depending on what is desired. Multiple thresholds can be used, and more than one possible response can occur based on the detected proximity of the object 1308. For example, a first response can occur if the object 1308 is within a first proximity range, and a second response can occur if the object 1308 is within a second proximity range. In the system 1300, the optoelectronic device 1302 is being used to detect the proximity of the object 1308, and thus, the device 1302 can also be referred to as an optical proximity sensor.

Figure 14A:
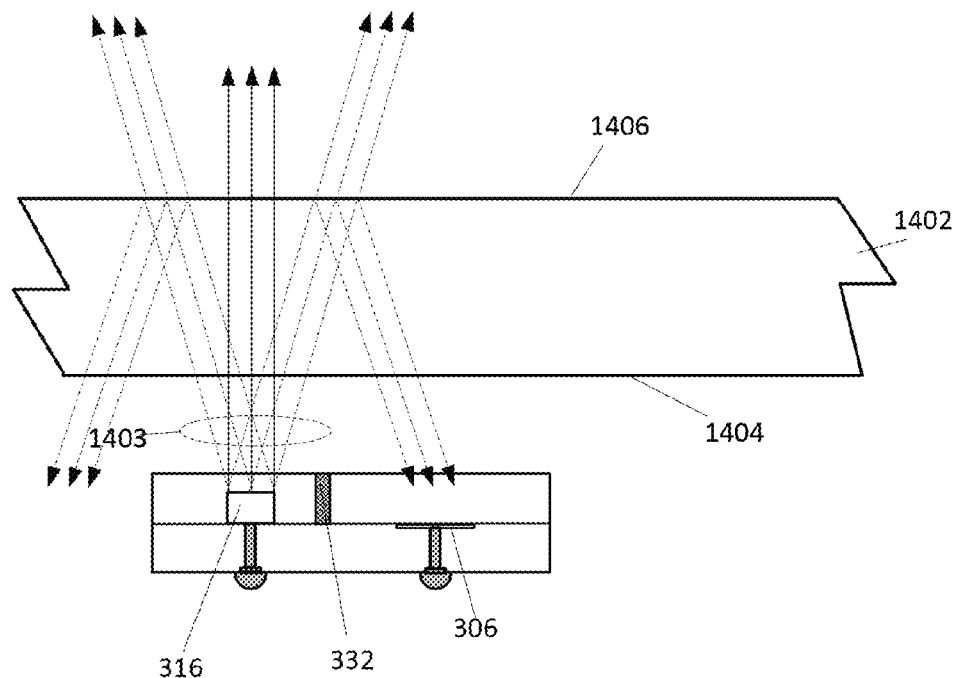
FIGS. 14A, 14B and 14C are used to describe why specular reflections may occur, and the function of specular reflection reducing shelves introduced in earlier FIGS.
Figure 14B:
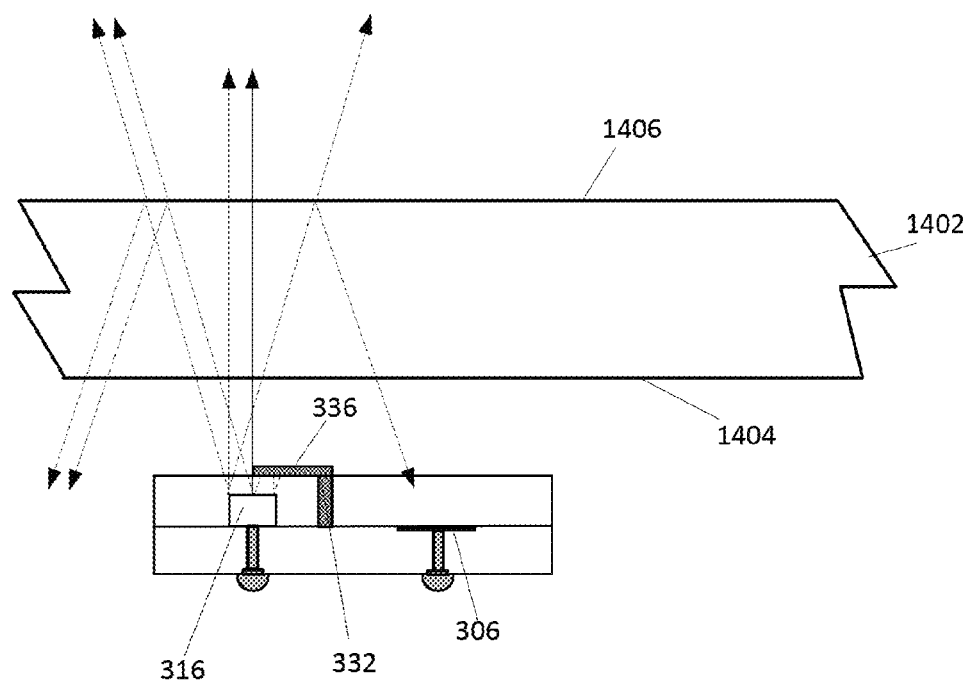
Figure 14C:
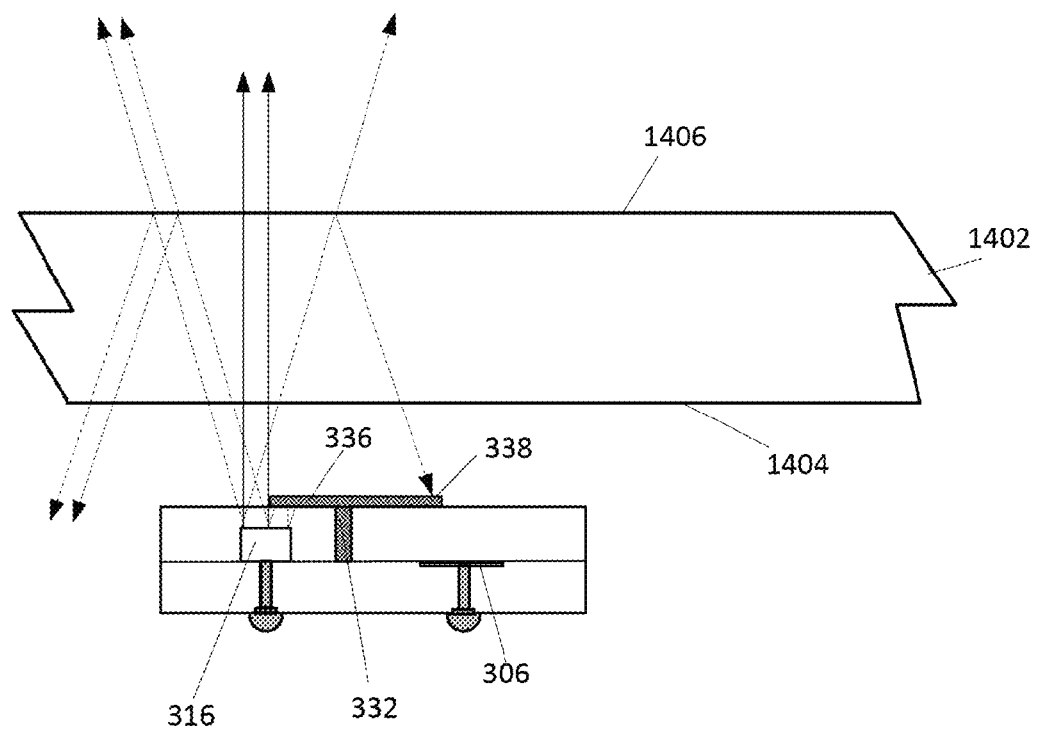

FIGS. 14A, 14B and 14C will now be used to further describe why specular reflections may occur, and the function of the specular reflection reducing shelves 336 and 338 introduced above. FIG. 14A illustrates an optoelectronic apparatus that includes a light source die 316 and a light detector sensor region 306, separated from one another by an opaque optical crosstalk barrier 332. Such an optoelectronic apparatus may be used as a proximity detector. As shown in FIG. 14A, the optoelectronic apparatus (including a light source die 316 and a light detector sensor region 306) may be used with (e.g., placed behind or covered by) a cover plate 1402, which can be made, e.g., of glass, plastic, or some other protective light transmissive material. Such a cover plate 1402 includes a close surface 1404 and far a surface 1406, with a thickness of the plate 1402 therebetween. While the close surface 1404 is shown as being a distance from the top surface of the optoelectronic apparatus, it is also possible that the close surface is in contact with (i.e., abuts against) the top surface of the optoelectronic apparatus. The cover plate 1402 can be, e.g., the glass covering a screen of a mobile phone, personal music player or personal data assistant (PDA), or the plastic covering the screen of a laptop computer, but is not limited thereto.

Exemplary light rays 1403 are also shown in FIG. 14A. As can be appreciated from FIG. 14A, at least some of the light rays, or portions thereof, can be reflected back toward the light detector sensor region 306 of the optoelectronic apparatus due to specular reflections. Just as it is desirable to minimize light being transmitted directly from the light source die 316 to the light detector sensor region 306, it is also desirable to minimize the specular reflections because such reflections similarly reduce the capability of the overall device to sense distance since they are essentially noise that contain no information. To reduce and preferably prevent the detection of specular reflections by the light detector sensor region, one or more specular reflection reducing shelves can be added, as described below with reference to FIGS. 14A and 14B.

Referring to FIG. 14B, the optical cross talk barrier 332 prevents light produced by the light source die 316 from travelling directly to the light detector sensor region 306. Additionally, an opaque vertical barrier 336, which can be referred to as a specular reflection reducing shelf 336, reduces specular reflections. This barrier 336, which extends from optical crosstalk barrier 332, forms a shelf over the light source die 316, and in certain embodiments, covers at least a portion of a light emitting element(s) of the light source die 316, as shown in FIG. 14B. As can be appreciated from a comparison between FIG. 14A and FIG. 14B, the shelf 336 reduces the amount of specular reflections, and thereby reduces (and preferably minimizes) the amount of light detected by the light detector sensor region 306 that would otherwise be due to specular reflections, if the optoelectronic device is used with a cover plate (e.g., 1402). In this manner, the specular reflection reducing shelf 336 increases the sensitivity of the optoelectronic device. Stated another way, the specular reflection reducing shelf 336 increases the percentage of light that will be detected by the light detector sensor region 306 that is actually due to reflections by an object on the far side of the cover plate 1402 (as opposed to reflections from the cover plate 1402 itself).

Referring to FIG. 14C, in accordance with certain embodiments, a further opaque vertical barrier 338 reduces the detection of specular reflections. This barrier 338 forms a shelf over the light detector sensor region 306, and in an embodiment, covers at least a portion of the light detector sensor region 306, as shown in FIG. 14C. As can be appreciated from a comparison between FIG. 14A and FIG. 14C, the shelf 338 reduces the amount of specular reflections that are detected by the light detector sensor region 306, and thereby, increases the sensitivity of the optoelectronic device. Stated another way, the specular reflection reducing shelf 338 blocks at least some specular reflections that would otherwise be detected by the light detector sensor region 306 if the shelf 338 were not included.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A method for fabricating a plurality of optoelectronic devices, comprising:

(a) performing through silicon via (TSV) processing on a wafer, which includes a plurality of light detector sensor regions, to thereby form a plurality of vias;

(b) tenting and plating the vias and performing wafer back metallization, after performing the TSV processing;

(c) attaching each of a plurality of light source dies to a top surface of the wafer; and (d) molding a light transmissive material to encapsulate the light detector sensor regions and the light sensor dies in the light transmissive material, after the (b) tenting and plating the vias and performing wafer back metallization, and after the (c) attaching the plurality of light source dies to the top surface of the wafer;

(e) fabricating opaque barriers including opaque optical crosstalk barriers;

(f) attaching solder balls or other electrical connectors to the bottom of the wafer; and (g) dicing the wafer to separate the wafer into a plurality of optoelectronic devices.

2. The method of claim 1, further comprising:
before the (a) performing TSV processing on the wafer, backgrinding a bottom of the wafer, which includes the plurality of light detector sensor regions, to achieve a specified thickness for the wafer.

3. The method of claim 2, wherein the (a) performing TSV processing on the wafer comprises performing bottom-up TSV processing on the wafer, after the backgrinding the bottom of the wafer.

4. The method of claim 3, wherein the (a) performing through silicon via (TSV) processing on the wafer, and the (b) tenting and plating the vias and performing wafer back metallization, are both performed before the (c) attaching the plurality of light source dies to the top surface of the wafer, and before the (d) molding the light transmissive material to encapsulate the light detector sensor regions and the light sensor dies in the light transmissive material.

5. The method of claim 2, wherein the (c) attaching the plurality of light source dies to the top surface of the wafer, is performed after the performing the backgrinding, after the (a) performing the TSV processing on the wafer, and after the (b) tenting and plating the vias and the performing wafer back metallization.

6. The method of claim 1, wherein the (f) attaching solder balls or other electrical connectors to the bottom of the wafer is performed before the (d) molding the light transmissive material to encapsulate the light detector sensor regions and the light sensor dies in the light transmissive material.

7. The method of claim 1, wherein the (f) attaching solder balls or other electrical connectors to the bottom of the wafer is performed after the (d) molding the light transmissive material to encapsulate the light detector sensor regions and the light sensor dies in the light transmissive material.

8. The method of claim 1, wherein each of the optoelectronic devices, resulting from the (g) dicing the wafer, includes at least one of the light detector sensor regions, at least one of the light source dies, one of the opaque optical crosstalk barriers between the at least one of the light detector sensor regions and the at least one of the light source dies, and at least two of the solder balls or other electrical connectors.

9. The method of claim 1, wherein the (e) fabricating opaque barriers also includes fabricating opaque specular reflection reducing shelves and opaque peripheral barriers.

10. The method of claim 9, wherein the fabricating the opaque optical crosstalk barriers, the specular reflection reducing shelves and the opaque peripheral barriers comprises molding an opaque material to produce the opaque optical crosstalk barriers, the specular reflection reducing shelves and the opaque peripheral barriers.

11. The method of claim 10, wherein the molding the light transmissive material, and the molding the opaque material to produce the opaque optical crosstalk barriers, the opaque specular reflection reducing shelves and the opaque peripheral barriers, are performed using a dual molding process.

12. The method of claim 9, wherein the fabricating opaque optical crosstalk barriers, the opaque specular reflection reducing shelves and peripheral barriers, comprises attaching preformed opaque optical crosstalk barriers, specular reflection reducing shelves and peripheral barriers to the wafer.

13. The method of claim 1, wherein each of the light detector sensor regions comprises a CMOS image sensor fabricated using CMOS device fabrication.

14. A method for fabricating a plurality of optoelectronic devices, comprising:

(a) forming a plurality of light detector sensor regions in a top surface of a wafer;

(b) after forming the plurality of light detector sensor regions in the top surface of the wafer, forming a plurality of vias in the wafer;

(c) after forming the plurality of vias in the wafer, tenting and plating the vias and performing wafer back metallization;

(d) after tenting and plating the vias and performing wafer back metallization, attaching a plurality of light source dies to the top surface of the wafer such that each of the light source dies is spaced apart from one of the light detector sensor regions;

(e) after attaching the plurality of light source dies to the top surface of the wafer, encapsulating the plurality of light detector sensor regions and the plurality of light source dies in a light transmissive molding material;

(f) attaching solder balls or other electrical connectors to the bottom of the wafer; and (g) separating the wafer into a plurality of optoelectronic devices.

15. The method of claim 14, wherein each of the light detector sensor regions comprises a CMOS image sensor fabricated using CMOS device fabrication.

16. The method of claim 14, further comprising, prior to separating the wafer into the plurality of optoelectronic devices, attaching, to the wafer, a preformed opaque structure made off-wafer from an opaque material, the preformed opaque structure including opaque vertical optical barriers.

17. The method of claim 16, wherein the preformed opaque structure made-off wafer is made from one or more etched sheets of opaque material, or is molded off-wafer.

18. The method of claim 14, further comprising, prior to separating the wafer into the plurality of optoelectronic devices, forming opaque optical crosstalk barriers on-wafer.

19. The method of claim 14, wherein the (f) attaching solder balls or other electrical connectors to the bottom of the wafer occurs at any time after the tenting and plating the vias and performing wafer back metallization, and prior to the separating the wafer into the plurality of optoelectronic devices.

20. A method for fabricating a plurality of optoelectronic devices, comprising:

(a) forming a plurality of light detector sensor regions in a top surface of a wafer;

(b) backgrinding a bottom of the wafer, which includes the plurality of light detector sensor regions, to achieve a specified thickness for the wafer;

(c) performing bottom-up through silicon via (TSV) processing on the wafer, after the backgrinding the bottom of the wafer;
(d) tenting and plating the vias and performing wafer back metallization, after performing the bottom-up TSV processing;
(e) attaching each of a plurality of light source dies to a top surface of the wafer, after the tenting and plating the vias and performing wafer back metallization;
(f) molding a light transmissive material to encapsulate the light detector sensor regions and the light sensor dies in the light transmissive material, after the attaching the plurality of light source dies to the top surface of the wafer;
(g) fabricating opaque barriers including opaque optical crosstalk barriers and specular reflection reducing shelves, such that each of the light detector sensor regions is separated from a respective one of the light source dies by one of the opaque optical crosstalk barriers;
(h) attaching solder balls or other electrical connectors to the bottom of the wafer; and
(i) dicing the wafer to separate the wafer into a plurality of optoelectronic devices.

* * * * *